United States Patent [19]
Chu et al.

[11] Patent Number: 5,686,699
[45] Date of Patent: Nov. 11, 1997

[54] SEMICONDUCTOR BOARD PROVIDING HIGH SIGNAL PIN UTILIZATION

[75] Inventors: Edwin Chu, Cupertino; Hu-Kong Lai, San Jose, both of Calif.

[73] Assignee: ACC Microelectronics Corporation, Santa Clara, Calif.

[21] Appl. No.: 760,347

[22] Filed: Dec. 4, 1996

Related U.S. Application Data

[63] Continuation of Ser. No. 541,424, Oct. 10, 1995, abandoned.
[51] Int. Cl.$^6$ .............. H01L 23/02; H01R 9/00; H05K 7/02
[52] U.S. Cl. .......... 174/52.4; 257/773; 257/774; 257/776; 257/786; 174/250; 174/260; 174/261; 174/262; 361/760; 361/764; 361/772; 361/777
[58] Field of Search ............ 174/52.1–52.4, 174/250, 2.6–2.64; 257/734, 737–738, 773–776, 779–780, 786; 361/712, 777, 820, 760–761, 764, 772; 29/827, 830, 852–853; 437/207, 209

[56] References Cited

U.S. PATENT DOCUMENTS

| | | | |
|---|---|---|---|
| 4,437,141 | 3/1984 | Prokop | 174/68.5 X |
| 5,216,278 | 6/1993 | Lin et al. | 257/688 |
| 5,241,133 | 8/1993 | Mullen, III et al. | 174/52.4 |
| 5,371,321 | 12/1994 | Hamzehdoost et al. | 174/52.4 |
| 5,450,290 | 9/1995 | Boyko et al. | 361/792 |
| 5,473,512 | 12/1995 | Degani et al. | 361/760 |
| 5,490,324 | 2/1996 | Newman | 29/830 |

*Primary Examiner*—Bot L. Ledynh
*Attorney, Agent, or Firm*—Thomas Schneck; George B.F. Yee

[57] ABSTRACT

A semiconductor die attach arrangement which provides an increase in signal availability to and from the die without compromising the physical integrity of signal traces and integrity of the conducted signal. In a preferred embodiment, a circuit board includes a die-attach region surrounded by a boundary line that is spaced apart from the die-attach region, thereby defining an intermediate region which surrounds the die-attach region. Bond sites are arranged along the boundary line. In one embodiment, the bond sites are first trace ends of a plurality of signal traces, some of the signal traces extending in an outward direction away from the die-attach region into a signal trace region, and some of the signal traces being directed within the intermediate region. Signal vias are formed in both the signal trace region and the intermediate region, and are electrically coupled to the signal traces at second trace ends of the signal traces. Formed on the other side of the circuit board, are solder bumps (solder balls) corresponding to the signal vias. By directing some of the signal traces into the intermediate region, board space is made available in the signal trace region so that signal traces can be fabricated without exceeding minimum pitch limitations. At the same time, the additional traces formed within the intermediate region provide additional signal paths to accommodate integrated circuit dies having high a number of I/O pads.

19 Claims, 4 Drawing Sheets

SEMICONDUCTOR BOARD PROVIDING HIGH SIGNAL PIN UTILIZATION

This application is a continuation of application Ser. No. 08/541,424, filed on Oct. 10, 1995, now abandoned.

TECHNICAL FIELD

The invention relates generally to integrated circuit dies and more particularly to a packaging arrangement which provides increased signal pin utilization.

BACKGROUND ART

There is a wide variety of chip packages for mounting and encapsulating an integrated circuit die. One type is referred to as a ball grid array (BGA) package. A BGA package includes a circuit board having an array of solder bumps (solder balls) to be used to provide mechanical and electrical connection to a motherboard or the like.

The integrated circuit die is typically connected to the surface of the BGA circuit board opposite to the surface having the array of raised solder bumps. U.S. Pat. No. 5,241,133 to Mullen, III et al. describes a chip package in which the integrated circuit die is adhered to the top surface of the circuit board of the package, so that the input/output pads of the die are exposed. Typically, wire bonds are used to electrically connect the input/output pads of the die to traces or pads on the circuit board. If the die is on the side of the circuit board opposite to the solder bumps, conductive vias are formed through the circuit to conduct signals from the solder bumps to the pads or traces. A molding compound may then be used to encapsulate the integrated circuit die and the wire bonds and to cover most or all of the surface of the circuit board opposite to the solder bumps.

A circuit board of a package for carrying an integrated circuit die having a high density of input/output pads will typically include signal traces that fan out with distance from the die. The bond wires have inner lead ends connected to the input/output pads of the die and have outer lead ends that connect to the inner trace ends of the signal traces which typically serve as bond sites. By fanning out with departure from the die, the array of signal traces may be considered to be a "space transformer." The ends of the signal traces furthest from the die may be spaced apart by greater distances, allowing the use of vias and solder bumps. The space transformation accommodates the high density input/output pads of the integrated circuit die.

However, various constraints limit the number of signal traces that can be fabricated on a BGA package. Industry standards impose specific requirements as to the spacing between solder balls, thereby restricting the spacing between the vias which electrically connect the signal traces to the solder bumps. The spacing restriction limits the number of signal traces that can fit between the vias which, in turn, limits the number of signal traces that can be used to carry signals to and from the die. Current fabrication technology imposes minimum pitch requirements for signal traces to attain satisfactory yields and to ensure mechanical and electrical reliability. The limitation on the maximum number of usable signal traces limits the maximum number of solder bumps, thereby placing a ceiling on the number of signals that a particular BGA package can provide.

An object of the invention is to provide a chip package in which an increase in conducted signals can be achieved without exceeding industry standards and without a sacrifice either of the mechanical reliability of the signal traces or of signal integrity.

SUMMARY OF THE INVENTION

The above object has been met by a chip package having, on one side of a circuit board, a central die-attach region surrounded by an intermediate region. The intermediate region is defined by a boundary line which surrounds the die-attach region and serves as the outer perimeter of the intermediate region. Arranged along the boundary line are bond sites to which the I/O pads of a die are wire bonded. A first set of signal vias is formed through the circuit board, within the intermediate region. Electrical paths between the bond sites and the first set of vias are provided by a corresponding set of signal traces. A signal trace region lying beyond the intermediate region is separated from the intermediate region by the boundary line. Within the signal trace region is a second set of signal vias formed through the circuit board. As with the first set of signal vias, a set of signal traces provides electrical connections between the bond sites and the signal vias in the signal trace region. In one embodiment of the invention, inner trace ends of the signal traces are arranged along the boundary line and serve as the bond sites. In another embodiment of the present invention, the signal vias within the intermediate region are arranged in a generally linear fashion, near to the bond sites. In yet another embodiment of the invention, the signal vias within the signal trace region are arranged in a grid pattern.

On the other side of the circuit board, is an array of solder bumps (solder balls), which are electrically connected to the signal vias formed through the circuit board and have a one-to-one correspondence with the signal vias. In one embodiment of the invention, the solder bumps are arranged in a grid pattern. The solder bumps which correspond to signal vias disposed within the signal trace region are formed proximal to the vias. The signal vias disposed within the intermediate region are electrically coupled to their corresponding solder bumps by way of signal traces.

An advantage of the present invention is that semiconductor dies which have high numbers of I/O pads can be used in packages that would normally preclude the use of such dies, due to the pitch limitations of the signal traces which bring out the I/O pads. The invention allows such packages to provide the additional pins (solder bumps) necessary to accommodate the additional I/O pads.

BEST MODE FOR CARRYING OUT THE INVENTION

Figure 1:
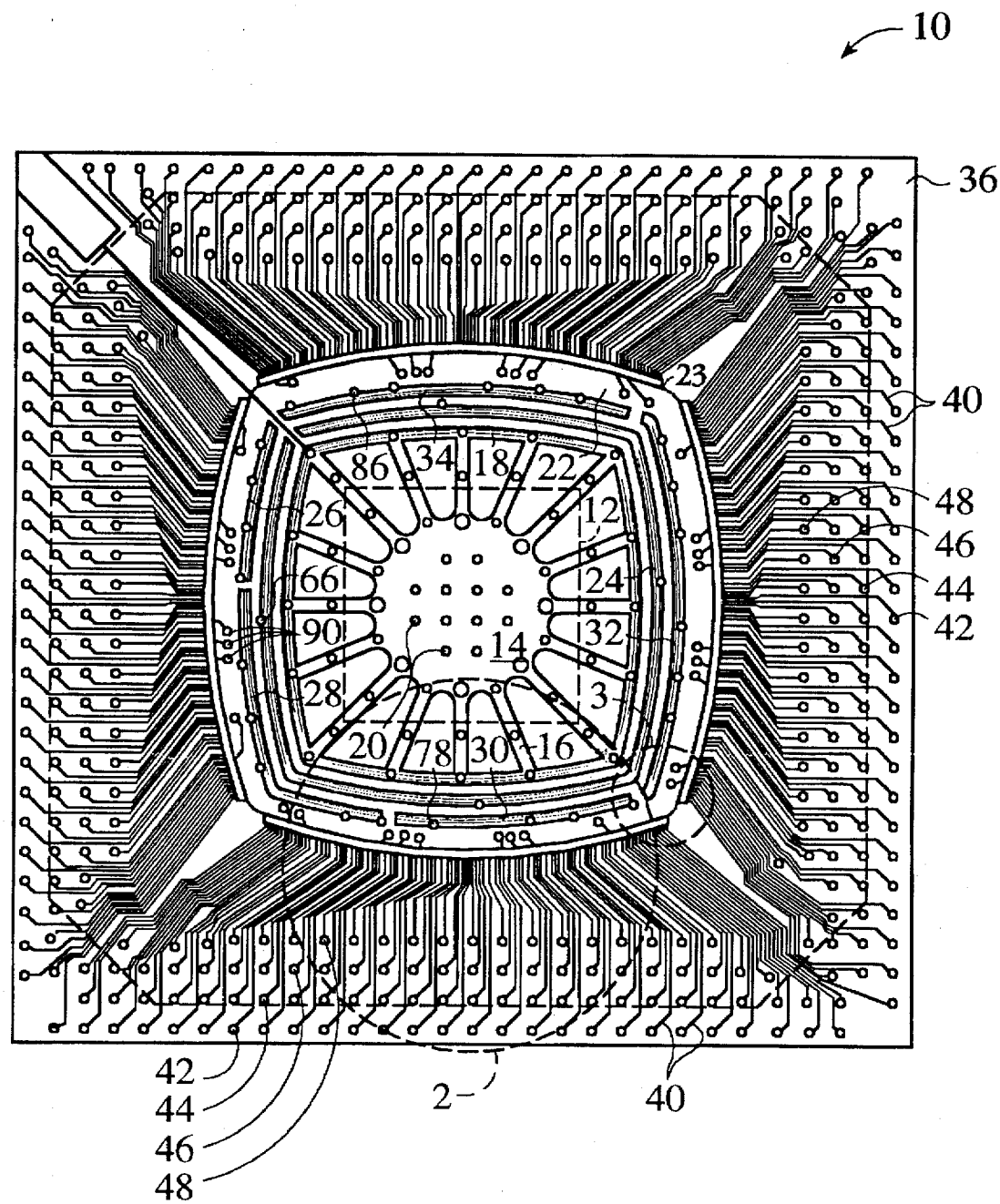
FIG. 1 is a top view of a circuit board of an integrated circuit package having a utility region in accordance with the invention.
Figure 2:
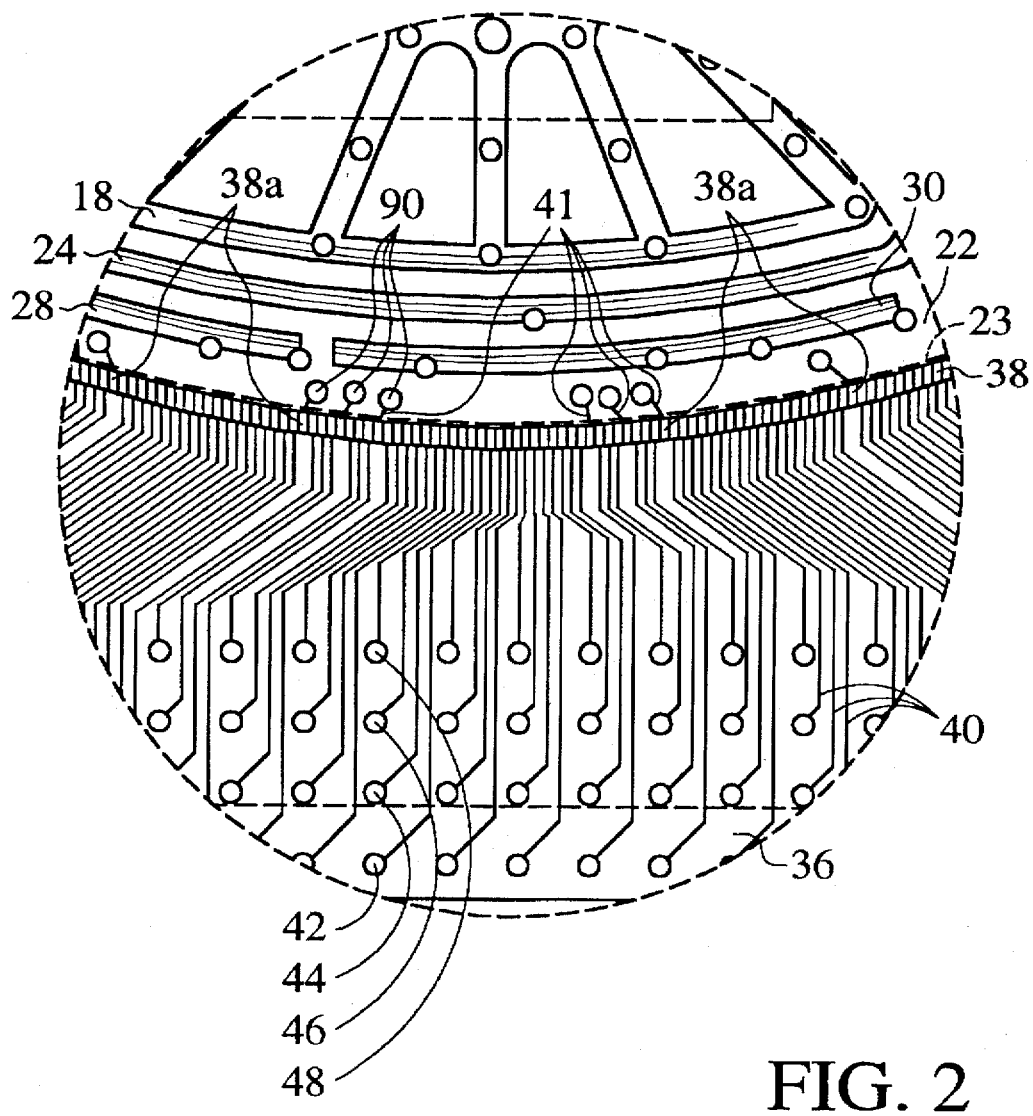
FIG. 2 is a top view of an area of FIG. 1, within circle 2.

With reference to FIGS. 1 and 2, a circuit board 10 is shown as having a central die-attach region 12 shown by dashed lines. As will be described more fully below, an integrated circuit die is connected to the die-attach region using conventional techniques. In the embodiment of FIGS. 1 and 2, the region includes a patterned metallization. At the center of the region is a solid metal area 14. Metallic legs 16 extend radially to a four-sided ground bus 18. Plated through, thermally conductive vias 20 contact the surface of the integrated circuit die and are used to conduct thermal energy from the die to the opposite side of the circuit board 10. The thermal energy is then conducted to a substrate to which the circuit board is attached.

Surrounding the die-attach region 12 is an intermediate region 22 bounded by a boundary line 23. The intermediate region includes "utility" traces, such as a ground bus 18, a $V_{DD}$ bus 24, and a segmented trace that includes five bus segments 26, 28, 30, 32 and 34.

In the present invention, the term "utility" is to be distinguished from the term "signal." The bond pads of the integrated circuit die primarily are composed of I/O pads for providing logic signals to and from the die. Such pads typically are known in the digital circuit arts as "signal" pads. By contrast, "utility" pads serve to provide grounding and power for the die. This distinction between "signals" and "utilities" will be adhered to in the discussion of the present invention which follows.

Figure 3:
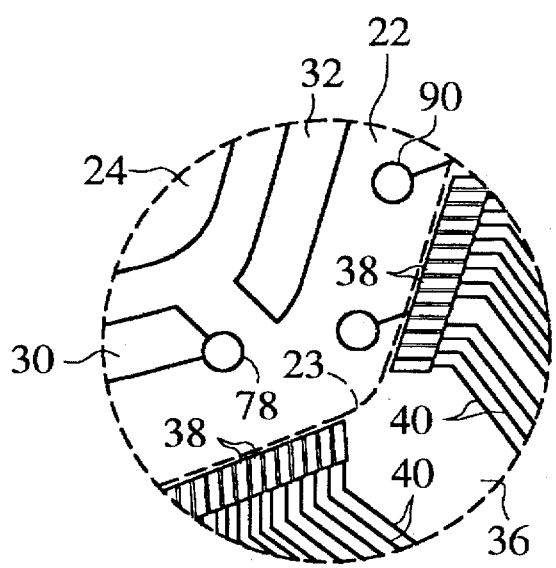
FIG. 3 is a top view of a limited number of inner trace ends of the signal traces of FIG. 1, within circle 3.

The boundary line 23 separates the intermediate region 22 from a signal trace region 36 which surrounds the intermediate region. The signal trace region includes an array of signal traces 40, as is well known in the art. Referring briefly to FIG. 3, the inner trace ends 38 are aligned along the boundary line 23, and serve as bond sites, providing points of electrical contact for bonding wires, not shown. The function of the bond wires is to conduct signals to and from the input/output pads of the integrated circuit die, and to provide fixed electrical potentials for the die. The individual bond wires include inner ends that are bonded to input/output pads of the die and include outer ends that are bonded to the inner trace ends 38 (bond sites) of the signal traces 40.

Returning to FIGS. 1 and 2, the signals are conducted along the surface of the circuit board 10 by means of the signal traces 40. Most of the traces 40 extend in a direction away from the die-attach region 12 to four rows of signal vias 42, 44, 46 and 48. The signal vias are electrically conductive through-holes that are formed using conventional techniques. The signal vias participate in the conduction of logic signals to and from the integrated circuit die. The signal vias are to be distinguished from the utility vias discussed below, which serve as conductive paths for ground and fixed electrical potentials such as $V_{DD}$.

Figure 4:
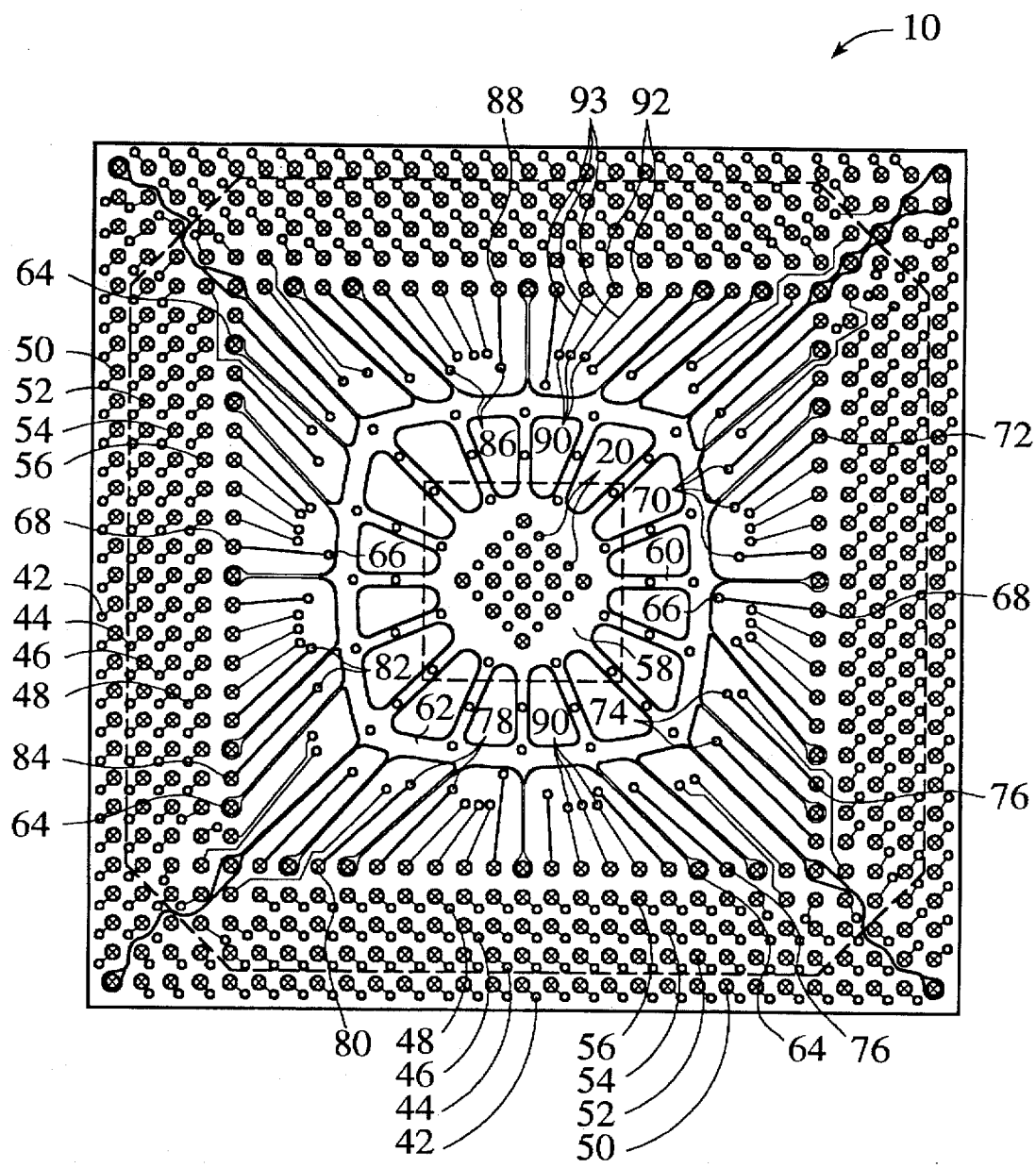
FIG. 4 is a bottom view of the circuit board of FIG. 1.

Referring now to FIGS. 1, 2 and 4, each of the signal vias 42–48 in the four rows of vias is electrically connected to a corresponding solder ball (solder bump) 50, 52, 54 and 56 formed on the bottom surface of the circuit board 10. Formation of the solder balls and their connection to the signal vias are accomplished by known conventional techniques. Note that there are four rows of signal vias, and so there are correspondingly four rows of solder balls. However, as will be explained more fully below, according to the present invention, the bottom side of the circuit board includes a number of solder bills formed in addition to the outermost four rows of solder balls. In operation, the solder balls on the bottom surface of the circuit board 10 are aligned with a corresponding array of contact pads on another substrate, such as a motherboard. By properly heating the solder, the circuit board is surface mounted to the motherboard to provide the necessary power and signal communication to the integrated circuit die attached at the top surface of the circuit board.

In addition to the four rows of solder balls 50–56 associated with the vias 42–48, the circuit board 10 of the present invention includes a fifth row of solder balls on the bottom surface of the circuit board. However, unlike the first four rows of solder balls, there is no corresponding fifth row of vias to provide an electrical connection to signal traces on the top surface (FIG. 1) of the circuit board. The reason for this is two-fold: Firstly, the industry standard limits the spacing between solder balls, and therefore the spacing between the vias, e.g. 42–48. Secondly, there is a minimum pitch limitation with current signal trace fabrication techniques. Therefore, the number of signal traces that can be formed between signal vias limits the number of rows of such vias to four. As shown in FIG. 1, with four rows of signal vias 42–48, three signal traces must be routed between adjacent columns of vias in order to connect the vias to the bond sites. Current fabrication technology limits the number of signal traces that can be routed in this manner to three, therefore limiting the number of rows of signal vias (and solder balls) to four. As will now be described, the present invention is able utilize a fifth row of solder balls to provide access to additional signals.

As shown in FIGS. 1 and 2, a number of signal vias 90 are formed within the intermediate region 22, between the inner trace ends 38 (arranged along the boundary line 23) and the die-attach region 12. The signal vias 90 are connected to selected inner trace ends 38a by short traces 41 on the top surface of the circuit board 10. Thus, in contrast to conventional chip carrier boards, some of the signals from the integrated circuit die will progress inwardly toward the die (i.e. toward signal vias 90), rather than in an outwardly direction toward signal vias 42–48. The signal vias 90 conduct the signal to the bottom surface of the circuit board. The signal vias 90 appear at the bottom surface of the circuit board as shown in FIG. 4. The vias are electrically connected to corresponding solder balls 92 in the fifth row of the ball grid array by way of signal traces 93. Thus, by providing signal vias 90 in the manner as described, a fifth row of solder balls 92, not typically included in prior art ball grid array packages, can be utilized to provide additional signals to the integrated circuit die. Limitations imposed on the fabrication of the signal traces 40 which, in turn, limit the number of available solder balls, are overcome by the presence of these inwardly located signal vias 90 of the present invention. This provides an advantage over prior art devices.

FIGS. 1 and 4 further show that the fifth row of solder balls is also used to provide ground and power to the integrated circuit die. Referring to FIG. 4, extending outwardly from the ground ring 62 on the bottom surface of the circuit board 10 are traces to grounded solder balls 64 in the fifth row of the five-row ball grid array. Regarding the $V_{DD}$ bus 24 on the top side of the circuit board 10, there are a number of power supply utility vias 66 that contact the $V_{DD}$ bus, penetrate the circuit board, and connect to $V_{DD}$ solder balls 68 on the bottom surface of the circuit board. Thus, the $V_{DD}$ voltage, e.g., five volts, is supplied to the top-side $V_{DD}$ bus 24 by connection to the $V_{DD}$ solder ball 68.

Likewise, the bus segments 26–34 are similarly connected to sources of a fixed potential. The bus segment 26 electrically contacts four power supply utility vias 70 that extend to separate $V_{cc1}$ balls 72. Top-side bus segment 28 contacts a number of power supply utility vias 74 that receive a fixed $V_{cc2}$ voltage from the motherboard by means of solder balls 76 in the innermost row in the ball grid array. The top-side bus segment 30 contacts power supply utility vias 78 that receive a $V_{cc3}$ voltage at solder balls 80. In a similar fashion, bus segment 32 receives a $V_{cc4}$ voltage by connection of power supply utility vias 82 to solder balls 84. In addition to the supply of the $V_{cc1}$ voltage at bus segment 26, bus segment 34 is connected to the $V_{cc1}$ supply by power supply utility vias 86 and solder balls 88.

The present invention provides for a ball grid array which has 419 bond sites, but is capable of utilizing 480 solder balls (solder bumps). This high utilization of solder bumps is made possible by having utility traces 18–34 (FIG. 1) to provide the ground and power supply buses independently of the bond sites. The utility traces allow the bond sites to be dedicated for carrying signals, thus increasing the number of signals that can be carried to and from the integrated circuit die. In addition, as explained above, the additional signal vias 90 disposed in the intermediate region 22 (FIGS. 1 and 2) further increase the utilization of solder bumps for carrying signals to and from the die.

Referring to FIG. 4, another advantage is realized by the additional solder balls of the present invention where critical signals are involved. For example, utility traces such as the ground and power supply buses should have large geometries to minimize noise artifacts. FIG. 4 shows that by locating all of the utility solder balls in the fifth row, the traces which electrically connect the utility vias to the utility solder balls are not constrained by the via spacing limitations of the first four rows of vias. These utility traces can be fabricated to be sufficiently wide so as to minimize unwanted noise. Likewise, the signal solder balls located in the fifth row of solder balls offer similar advantages for critical signals such as high frequency signals. The traces carrying such signals tend to generate noise and produce unwanted crosstalk with adjacent traces, and preferably should be shielded. By locating these critical solder balls appropriately in the fifth row, their corresponding signal traces can be positioned between ground traces to provide sufficiently effective shielding of the signals.

Figure 5:
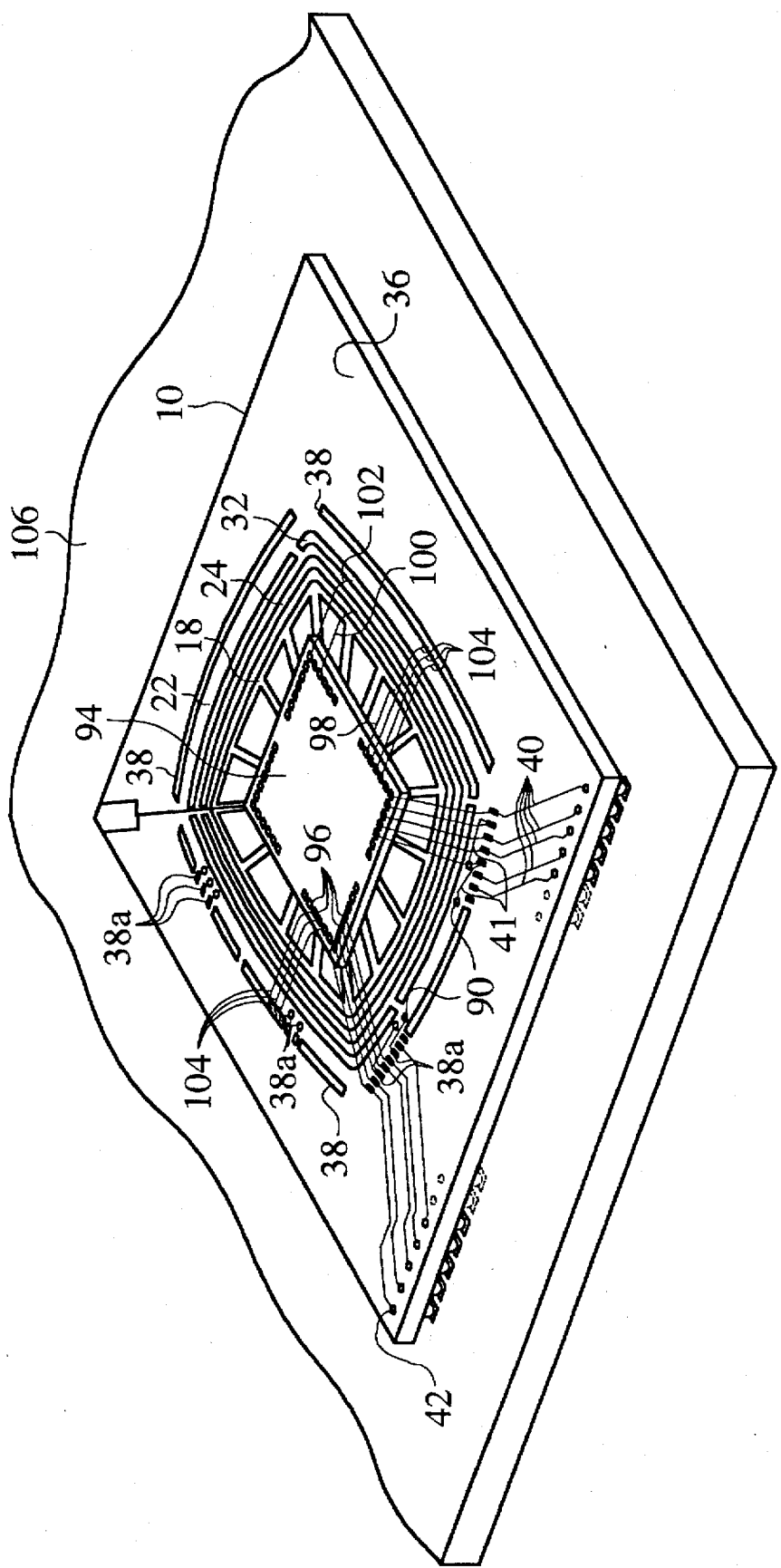
FIG. 5 is a perspective view of an integrated circuit die in electrical and mechanical connection to the circuit board of FIG. 1.

Referring now to FIG. 5, an integrated circuit die 94 is shown as being attached to the circuit board 10. The bonding wires have inner lead ends connected to input/output pads 96 of the die. The leads are attached to various points on the circuit board. For example, most of the leads 104 are connected to the trace ends 38, while other leads are connected in the manner as explained below.

A portion of the circuit board illustrates, in detail, the arrangement of the signal traces 40 and the trace ends 38 (bond sites) arranged along one side of the die in accordance with the present invention. FIG. 5 shows that most of the signal traces 40, as conventionally taught, extend away from the die, toward the signal vias 42–48 (FIG. 1) within the signal trace region 36. However, the signal traces 41 of selected trace ends 38a extend toward the die, and connect with signal vias 90 formed within the intermediate region 22. By re-directing some of the signal traces 41 in this manner, sufficient board space is made preserved so that the conventional signal traces 40 can be fabricated without having to exceed their pitch limitations. The signal traces 40, 41 and trace ends 38, 38a formed along the remaining sides of the die 94 are similarly arranged; the detail has been omitted for the purposes of clarity.

FIG. 5 also shows that other bond wires are attached to the inner ground bus 18, the $V_{DD}$ bus 24, and the bus segments 26–34 of FIG. 1. A lead 98 has an outer lead end connected to the ground bus 18 in the intermediate region 22 of the circuit board 10. Another lead 100 has an outer lead end connected to the $V_{DD}$ bus 24 within the intermediate region. Yet another lead 102 has an outer lead end connected to bus segment 32 to provide the fixed $V_{cc4}$ voltage to the integrated circuit die 94.

The signals and the required fixed electrical potentials are acquired from the motherboard 106 by matching the ball grid array on the bottom surface of the circuit board 10 with a corresponding array on the motherboard. Surface mounting by means of a ball grid array is known in the art. However, the embodiment of FIGS. 1–5 includes a fifth row of solder balls and includes a central array of solder balls for conducting thermal energy from the integrated circuit die 94 to the motherboard 106. Preferably, the thermal energy is conducted to a ground plane (not shown) of the motherboard, so that the energy is dispersed.

We claim:

1. A substrate for an integrated circuit package comprising:
    an insulative member having opposed first and second sides and a semiconductor die-attach region on said first side;
    a plurality of bond sites formed on said first side; and
    a plurality of signal traces, each of which extends from one of said plurality of bond sites and terminates in a signal via formed through said insulative member to extend between said first and second sides with a first subset of said plurality of signal traces extending outwardly away from said die-attach region and a second subset of signal traces extending inwardly toward said die-attach region.

2. The substrate of claim 1 further including a boundary spaced-apart from, and surrounding, said die-attach region, defining an intermediate region, positioned between said die-attach region and said boundary, and a signal trace region spaced-apart from said intermediate region, with said plurality of bond sites located between said intermediate region and said signal trace region, said subset of said plurality of signal traces lying across said signal trace region and said second subset of said plurality of signal traces lying across said intermediate region.

3. The substrate of claim 2 wherein each of said plurality of bond sites are terminal ends of one of said plurality of signal traces, with said plurality of bond sites arranged in two different sets of multiple bond pads, a first bond pad in each of said two sets being disposed spaced-apart from an adjacent to a second bond pad of the same set.

4. The substrate of claim 2 further including a plurality of solder balls disposed on said second side of said insulative member, said solder balls being electrically connected to a via of one of said plurality of traces.

5. The substrate of claim 4 wherein said plurality of solder balls are arranged in a grid pattern to form a ball grid array and vias associated with said first subset of traces are arranged in a grid pattern.

6. The substrate of claim 4 further including conductive patterned traces formed on said second side of said insulative member, said conductive patterned traces being connected between said vias associated with said second subset of traces and a subset of said plurality of solder balls.

7. The substrate of claim 4 wherein a subset of said plurality of solder balls are disposed proximate to vias associated with said second subset of signal traces.

8. The substrate of claim 1 wherein vias associated with said second subset of signal traces are disposed proximate to said bond sites.

9. The substrate of claim 1 wherein said plurality of bond sites are arranged along a line having a generally arcuate shape.

10. The substrate of claim 1 wherein said plurality of bond sites are arranged in a plurality of groups, with each group of bond sites arranged along a line, forming a plurality of lines of bond sites, with each of said plurality of lines of bond sites extending transverse to the remaining lines of bond sites, with said plurality of lines of bonds sites having a generally arcuate shape.

11. A chip package comprising:

a circuit board having opposed first and second surfaces, said first surface having an inner die-attach region, an intermediate region and an outer region surrounding said intermediate region, said first surface further having a plurality of signal traces formed thereon, said signal traces having first trace ends arranged along a boundary between said intermediate region and said outer region, with said first trace ends defining a plurality of bond sites, said first surface further having a plurality of signal vias formed through said circuit board and arranged in first and second groups, said first group of signal vias being formed within said intermediate region and said second group of vias being formed within said outer region, said signal traces having second trace ends, said second trace ends being electrically coupled to said signal vias, with signal traces extending between said plurality of bond sites and vias of said first group defining a first set of signal traces, and signal traces extending between said plurality of bond sites and vias of said second group defining a second set of signal traces, said first set of signal traces being disposed between said die-attach region said second set of signal traces, said second surface having a plurality of solder bumps formed thereon, with each of said plurality of solder bumps being placed in electrical communication with one of said plurality of vias through an electrically conductive trace formed on said second surface, an integrated circuit die attached within said die-attach region of said first surface, said die having a plurality of input/output pads, and a plurality of bonding wires having inner lead ends bonded to said input/output pads of said die and having outer lead ends, a plurality of said outer lead ends being electrically coupled to said first trace ends.

12. The chip package of claim 11 wherein said plurality of solder bumps formed on said second surface are arranged in a grid pattern, with said second group of signal vias being arranged in a grid pattern and said first group of signal vias arranged in an arbitrary pattern.

13. The chip package of claim 10 wherein said second group of signal vias are arranged proximate to said corresponding solder bumps.

14. The chip package of claim 11 wherein said first group of signal vias have a generally linear arrangement and are disposed proximate to said first trace ends.

15. The substrate of claim 11 further including an integrated circuit die attached within said die-attach region of said first surface, said die having a plurality of input/output pads; and a plurality of bonding wires having inner lead ends bonded to said input/output pads of said die and having outer lead ends, a plurality of said outer lead end being electrically coupled to said first trace ends.

16. A substrate for an integrated circuit package comprising:

an insulative member having opposed first and second sides and a semiconductor die-attach region disposed on said first side, said insulative member including a plurality of vias arranged in first and second groups, with each of said plurality of vias extending between said first and second sides;

a plurality of spaced-apart and adjacent bond sites formed on said first side generally defining a boundary, with said first and second groups disposed on opposite side of said boundary; and a plurality of signal traces, with signals traces extending between one of said plurality of bond sites and a via of said first group defining a first set of signal traces, and signal traces extending between one of said plurality of bond pads and a via of said second group defining a second set of signal traces, with a portion of each signal trace of said first set extending from one of said plurality of bond sites toward a via of said first group in a direction opposite to a portion of each signal trace of said second set extending from one of said plurality of bonds sites toward a via of said second group.

17. The substrate of claim 16 wherein each of said plurality of bond sites are terminal ends of one of said plurality of signal traces, with said plurality of bond sites arranged into multiple sets of bond pads disposed to surround said die attach region.

18. The substrate of claim 16 wherein said boundary has an arcuate shape with said bond sites aligned along said boundary.

19. The substrate of claim 18 further including an integrated circuit die attached within said die-attach region of said first surface, said die having a plurality of input/output pads; and a plurality of bonding wires having inner lead ends bonded to said input/output pads of said die and having outer lead ends, a plurality of said outer lead ends being electrically coupled to said plurality of signal traces.

* * * * *

UNITED STATES PATENT AND TRADEMARK OFFICE
CERTIFICATE OF CORRECTION

PATENT NO. : 5,686,699
DATED : November 11, 1997
INVENTOR(S) : Edwin Chu et al.

It is certified that error appears in the above-identified patent and that said Letters Patent is hereby corrected as shown below:

Column 3, line 55, "solder bills" should read - - solder balls - -.

Claim 2, column 6, line 29, "said subset" should read - - said first subset - -.

Claim 15, column 8, line 7, "said outer lead end being" should read - - said outer lead ends being - -.

Signed and Sealed this

Thirty-first Day of March, 1998

Attest:

BRUCE LEHMAN

Attesting Officer     Commissioner of Patents and Trademarks